(12) United States Patent
Kim et al.

(10) Patent No.: US 11,377,557 B2
(45) Date of Patent: Jul. 5, 2022

(54) HYDROSILYLATION-CURABLE SILICONE COMPOSITION

(71) Applicant: DOW SILICONES CORPORATION, Midland, MI (US)

(72) Inventors: Sun Hee Kim, Gyeonggi-do (KR); Min Hee Kwon, Gyeonggi-do (KR)

(73) Assignee: DOW SILICONES CORPORATION, Midland, MI (US)

( * ) Notice: Subject to any disclaimer, the term of this patent is extended or adjusted under 35 U.S.C. 154(b) by 0 days.

(21) Appl. No.: 16/756,301

(22) PCT Filed: Nov. 14, 2018

(86) PCT No.: PCT/US2018/060927
§ 371 (c)(1),
(2) Date: Apr. 15, 2020

(87) PCT Pub. No.: WO2019/099449
PCT Pub. Date: May 23, 2019

(65) Prior Publication Data
US 2020/0332122 A1 Oct. 22, 2020

Related U.S. Application Data

(60) Provisional application No. 62/587,235, filed on Nov. 16, 2017.

(51) Int. Cl.
| | | |
|---|---|---|
| *C08L 83/04* | (2006.01) | |
| *C09D 183/04* | (2006.01) | |
| *C09J 183/04* | (2006.01) | |
| *C09K 3/10* | (2006.01) | |

(52) U.S. Cl.
CPC ............ *C08L 83/04* (2013.01); *C09D 183/04* (2013.01); *C09J 183/04* (2013.01); *C09K 3/1018* (2013.01); *C08L 2203/206* (2013.01); *C08L 2205/025* (2013.01); *C08L 2205/035* (2013.01); *C09K 2200/0685* (2013.01)

(58) Field of Classification Search
CPC ......... C08G 77/12; C08G 77/20; C08L 83/04; C09J 183/04
See application file for complete search history.

(56) References Cited

U.S. PATENT DOCUMENTS

| | | |
|---|---|---|
| 3,445,420 A | 5/1969 | Kookootsedes et al. |
| 6,649,016 B2 | 11/2003 | Wu et al. |
| 7,900,286 B2 | 3/2011 | Black |
| 9,441,086 B2 | 9/2016 | Albaugh et al. |
| 9,671,693 B2 | 6/2017 | Ichikawa et al. |
| 10,336,913 B2 | 7/2019 | Nishijima et al. |
| 2007/0289495 A1 | 12/2007 | Cray et al. |
| 2009/0225640 A1 | 9/2009 | Manabe et al. |
| 2017/0190879 A1 | 7/2017 | Iimura et al. |
| 2020/0308405 A1 | 10/2020 | Kuramoto et al. |

FOREIGN PATENT DOCUMENTS

| | | |
|---|---|---|
| JP | 06-145526 | 5/1994 |
| JP | 06145526 * | 5/1994 |
| JP | 2007269910 A | 10/2007 |
| JP | 2008156441 A | 7/2008 |
| JP | 2004323764 A | 11/2008 |
| JP | 2012017427 A | 1/2012 |
| JP | 05571295 B2 | 8/2014 |

OTHER PUBLICATIONS

JP 06 145526 machine translation (1994).*
Search report for corresponding China Application No. 201880073372.3 dated Feb. 26, 2021.
Search report for corresponding Japanese Application No. 2020-526276 dated May 17, 2021.

* cited by examiner

*Primary Examiner* — Kuo Liang Peng
(74) *Attorney, Agent, or Firm* — S. Matthew Cairns

(57) ABSTRACT

The present invention relates to a hydrosilylation-curable silicone composition comprising: a maleate compound, and a hydrosilylation inhibitor other than the maleate compound, wherein the content of the maleate compound is in an amount of 50 to 6,000 ppm and the content of the hydrosilylation inhibitor is in an amount of 200 to 20,000 ppm, with respect to the present composition in terms of mass units, respectively. The hydrosilylation-curable silicone composition exhibits good storage stability, and can be cured to form a cured product that suffers no surface wrinkling.

5 Claims, No Drawings

HYDROSILYLATION-CURABLE SILICONE COMPOSITION

TECHNICAL FIELD

The present invention relates to a hydrosilylation-curable silicone composition.

BACKGROUND ART

Hydrosilylation-curable silicone compositions form cured products having excellent characteristics such as weather resistance and heat resistance, and they cure particularly quickly by heating, without producing by-products at the time of curing, so such compositions are used to seal, cover, or adhere optical semiconductor elements in optical semiconductor devices. It is well known that at least one hydrosilylation inhibitor is added to adjust curability and storage stability of the compositions. However, reducing the curing temperature and enabling shorter curing times causes a marked deterioration of storage stability of the compositions, and low temperature curing promotes wrinkling of the surface of the cured products. To solve such problems, some curable silicone compositions are proposed.

Examples of such curable silicone compositions include a curable silicone composition comprising: an alkenyl group-containing organopolysiloxane, an organohydrogenpolysiloxane, a hydrosilylation catalyst, and an amide compound (see Patent Document 1); a curable silicone composition comprising: an organopolysiloxane having at least two alkenyl groups per molecule, an organohydrogenpolysiloxane having at least two silicon-bonded hydrogen atoms per molecule, a platinum group metal based catalyst; and a dihydrodisilane compound (see Patent Document 2); and a curable silicone composition comprising: an organopolysiloxane having at least one silicon-bonded alkenyl group per molecule, an organohydrogenpolysiloxane having per molecule at least one silicon-bonded hydrogen atom at a molecular chain terminal, and at least two silicon-bonded hydrogen atoms at non-molecular chain terminals, and a hydrosilylation catalyst (see Patent Document 3).

However, it was difficult to be consistent with good curability and preventing the surface of the cured product from wrinkling by curing at relatively low temperatures.

PRIOR ART DOCUMENTS

Patent Documents

Patent Document 1: Japanese Patent Application Publication No. Hei 08-183908 A
Patent Document 2: Japanese Patent Application Publication No. 2001-26716 A
Patent Document 3: United States Patent Application Publication No. 2005/0272893 A1

SUMMARY OF INVENTION

Technical Problem

An object of the present invention is to provide a hydrosilylation-curable silicone composition that exhibits good storage stability, and can be cured to form a cured product that suffers no surface wrinkling.

Solution to Problem

The hydrosilylation-curable silicone composition of the present invention is characterized by comprising: a maleate compound, and a hydrosilylation inhibitor other than the maleate compound, wherein the content of the maleate compound is in an amount of 50 to 6,000 ppm and the content of the hydrosilylation inhibitor is in an amount of 200 to 20,000 ppm, with respect to the composition in terms of mass units, respectively.

The hydrosilylation-curable silicone composition of the present invention preferably comprises:
(A) an organopolysiloxane having at least two alkenyl groups per molecule;
(B) an organohydrogenpolysiloxane having at least two silicon-bonded hydrogen atoms per molecule, in an amount such that 0.1 to 10.0 moles of the silicon atom-bonded hydrogen atoms is provided relative to 1 mole of the alkenyl groups in component (A);
(C) a hydrosilylation catalyst, in an amount sufficient to accelerate curing of the composition;
(D) a maleate compound, in an amount of 50 to 6,000 ppm with respect to the composition in terms of mass units; and
(E) a hydrosilylation inhibitor other than the maleate compound, in an amount of 200 to 20,000 ppm with respect to the composition in terms of mass units.

The hydrosilylation-curable silicone composition of the present invention may comprise (F) an adhesion promoter, in an amount of from 0.01 to 50 parts by mass per 100 parts by mass of components (A) to (E).

The hydrosilylation-curable silicone composition of the present invention may comprise (G) a cerium-containing organopolysiloxane, in an amount such that the amount of cerium atoms in this component is from 10 to 2,000 ppm with respect to the composition in terms of mass units.

The hydrosilylation-curable silicone composition of the present invention is preferably a sealing, a coating, or an adhesive for an optical semiconductor element.

Effects of Invention

The hydrosilylation-curable silicone composition of the present invention exhibits good storage stability, and can be cured even at low temperatures, generates a cured product that suffers no surface wrinkling.

DETAILED DESCRIPTION OF THE INVENTION

The hydrosilylation-curable silicone composition of the present invention is characterized by comprising: a maleate compound, and a hydrosilylation inhibitor other than the maleate compound, wherein the content of the maleate compound is in an amount of 50 to 6,000 ppm and the content of the hydrosilylation inhibitor is in an amount of 200 to 20,000 ppm, with respect to the present composition in terms of mass units, respectively.

The curable silicone composition of the present invention preferably comprises:
(A) an organopolysiloxane having at least two alkenyl groups per molecule;
(B) an organohydrogenpolysiloxane having at least two silicon-bonded hydrogen atoms per molecule, in an amount such that 0.1 to 10.0 moles of silicon-bonded hydrogen atoms is provided relative to 1 mole of alkenyl groups in component (A);
(C) a hydrosilylation catalyst, in an amount sufficient to accelerate curing of the composition;

(D) a maleate compound, in an amount of 50 to 6,000 ppm with respect to the composition in terms of mass units; and (E) a hydrosilylation reaction inhibitor other than the maleate compound, in an amount of 200 to 20,000 ppm with respect to the composition in terms of mass units.

Component (A) is an organopolysiloxane having at least two alkenyl groups per molecule. Examples of the alkenyl groups include alkenyl groups having from 2 to 12 carbons such as vinyl groups, allyl groups, butenyl groups, pentenyl groups, hexenyl groups, heptenyl groups, octenyl groups, nonenyl groups, decenyl groups, undecenyl groups, and dodecenyl groups. Vinyl groups are preferred. Examples of silicon-bonded groups other than the alkenyl groups in component (A) include alkyl groups having from 1 to 12 carbons such as methyl groups, ethyl groups, propyl groups, isopropyl groups, butyl groups, isobutyl groups, tert-butyl groups, pentyl groups, neopentyl groups, hexyl groups, cyclohexyl groups, heptyl groups, octyl groups, nonyl groups, decyl groups, undecyl groups, and dodecyl groups; aryl groups having from 6 to 20 carbons such as phenyl groups, tolyl groups, xylyl groups, and naphthyl groups; aralkyl groups having from 7 to 20 carbons such as benzyl groups, phenethyl groups, and phenylpropyl groups; and these groups in which a part or all of the hydrogen atoms is substituted with a halogen atom such as a fluorine atom, a chloride atom, and a bromine atom. The silicon atoms in component (A) may be bonded to hydroxyl groups or alkoxy groups such as methoxy groups and ethoxy groups in a small amount as long as the object of the present invention is not impaired.

The molecular structure of component (A) is not particularly limited, and examples thereof include linear, partially branched linear, cyclic, and three-dimensional network structures. Component (A) may be one type of organopolysiloxane having the molecular structures or a mixture of two or more types of organopolysiloxane having the molecular structures.

The state of component (A) at 25° C. is not particularly limited, and examples thereof include a liquid and a solid. When component (A) is a liquid at 25° C., the viscosity at 25° C. is preferably in the range of from 1 to 1,000,000 mPa·s, and particularly preferably in the range of from 10 to 1,000,000 mPa·s.

Examples of such component (A) include a dimethylpolysiloxane having both molecular terminals capped with dimethylvinylsiloxy groups, a dimethylsiloxane-methylvinylsiloxane copolymer having both molecular terminals capped with dimethylvinylsiloxy groups, a dimethylsiloxane-methylphenylsiloxane copolymer having both molecular terminals capped with dimethylvinylsiloxy groups, a methylphenylpolysiloxane having both molecular terminals capped with dimethylvinylsiloxy groups, a dimethylsiloxane-methylvinylsiloxane copolymer having both molecular terminals capped with trimethylsiloxy groups, a dimethylsiloxane-methylvinylsiloxane-methylphenylsiloxane copolymer having both molecular terminals capped with trimethylsiloxy groups, a copolymer including $(CH_3)_3SiO_{1/2}$ units, $(CH_3)_2(CH_2=CH)SiO_{1/2}$ units, and $C_6H_5SiO_{3/2}$ units, a copolymer including $(CH_3)_2(CH_2=CH)SiO_{1/2}$ unit and $C_6H_5SiO_{3/2}$ unit, a copolymer including $(CH_3)_3SiO_{1/2}$ units, $(CH_3)_2(CH_2=CH)SiO_{1/2}$ units, and $SiO_{4/2}$ units, a copolymer including $(CH_3)_2(CH_2=CH)SiO_{1/2}$ units and $SiO_{4/2}$ units, and the following organopolysiloxanes. Note that, in the formulae, Me, Vi, and Ph represent a methyl group, a vinyl group, and a phenyl group, respectively, and x and x' are each an integer of from 1 to 100.

$ViMe_2SiO(Me_2SiO)_xSiMe_2Vi$
$ViPhMeSiO(Me_2SiO)_xSiMePhVi$
$ViPh_2SiO(Me_2SiO)_xSiPh_2Vi$
$ViMe_2SiO(Me_2SiO)_x(Ph_2SiO)_xSiMe_2Vi$
$ViPhMeSiO(Me_2SiO)_x(Ph_2SiO)_xSiPhMeVi$
$ViPh_2SiO(Me_2SiO)_x(Ph_2SiO)_xSiPh_2Vi$
$ViMe_2SiO(MePhSiO)_xSiMe_2Vi$
$MePhViSiO(MePhSiO)_xSiMePhVi$
$Ph_2ViSiO(MePhSiO)_xSiPh_2Vi$
$ViMe_2SiO(Ph_2SiO)_x(PhMeSiO)_xSiMe_2Vi$
$ViPhMeSiO(Ph_2SiO)_x(PhMeSiO)_xSiPhMeVi$
$ViPh_2SiO(Ph_2SiO)_x(PhMeSiO)_xSiPh_2Vi$

Component (B) is an organohydrogenpolysiloxane having at least two silicon-bonded hydrogen atoms per molecule. Examples of the molecular structure of component (B) include linear, partially branched linear, branched chain, cyclic, and dendritic structures, and linear, partially branched linear, and dendritic structures are preferred. The bonding positions of the silicon-bonded hydrogen atoms in component (B) are not limited, and examples thereof include terminals and/or side chains of molecular chain. Examples of silicon-bonded groups other than hydrogen atoms in component (B) include alkyl groups such as methyl groups, ethyl groups, and propyl groups; aryl groups such as phenyl groups, tolyl groups, and xylyl groups; aralkyl groups such as benzyl groups and phenethyl groups; and halogenated alkyl groups such as 3-chloropropyl groups and 3,3,3-trifluoropropyl groups. Methyl groups and phenyl groups are preferred. The viscosity at 25° C. of component (B) is not particularly limited, and is preferably in the range of from 1 to 10,000 mPa·s, and particularly preferably in the range of from 1 to 1,000 mPa·s.

Examples of such an organohydrogenpolysiloxane for component (B) include 1,1,3,3-tetramethyldisiloxane, 1,3,5,7-tetramethylcyclotetrasiloxane, tris(dimethylhydrogensiloxy)methylsilane, tris(dimethylhydrogensiloxy)phenylsilane, 1-glycidoxypropyl-1,3,5,7-tetramethylcyclo-tetrasiloxane, 1,5-diglycidoxypropyl-1,3,5,7-tetramethylcyclotetrasiloxane, 1-glycidoxypropyl-5-trimethoxysilylethyl-1,3,5,7-tetramethylcyclotetrasiloxane, a methylhydrogenpolysiloxane having both molecular terminals capped with trimethylsiloxy groups, a dimethylsiloxane-methylhydrogensiloxane copolymer having both molecular terminals capped with trimethylsiloxy groups, a dimethylpolysiloxane having both molecular terminals capped with dimethylhydrogensiloxy groups, a dimethylsiloxane-methylhydrogensiloxane copolymer having both molecular terminals capped with dimethylhydrogensiloxy groups, a methylhydrogensiloxane-diphenylsiloxane copolymer having both molecular terminals capped with trimethylsiloxy groups, a methylhydrogensiloxane-diphenylsiloxane-dimethylsiloxane copolymer having both molecular terminals capped with trimethylsiloxy groups, a hydrolysis-condensation product of trimethoxysilane, a copolymer including a $(CH_3)_2HSiO_{1/2}$ unit and an $SiO_{4/2}$ unit, a copolymer including a $(CH_3)_2HSiO_{1/2}$ unit, an $SiO_{4/2}$ unit, and a $(C_6H_5)SiO_{3/2}$ unit, and the following organohydrogenpolysiloxanes. In the formulae, Me, Vi, Ph, and NapH represent a methyl group, a vinyl group, a phenyl group, and a naphthyl group, respectively, y and y' are each an integer of from 1 to 100, and c, d, e, and f are positive numbers, provided that the sum of c, d, e, and f in the molecule is 1.

$HMe_2SiO(Ph_2SiO)_ySiMe_2H$
$HMePhSiO(Ph_2SiO)_ySiMePhH$

HMeNaphSiO(Ph$_2$SiO)$_y$SiMeNaphH
HMePhSiO(Ph$_2$SiO)$_y$(MePhSiO)$_y$,SiMePhH
HMePhSiO(Ph$_2$SiO)$_y$(Me$_2$SiO)$_y$,SiMePhH
(HMe$_2$SiO$_{1/2}$)$_c$(PhSiO$_{3/2}$)$_d$
(HMePhSiO$_{1/2}$)$_c$(PhSiO$_{3/2}$)$_d$
(HMePhSiO$_{1/2}$)$_c$(NaphSiO$_{3/2}$)$_d$
(HMe$_2$SiO$_{1/2}$)$_c$(NaphSiO$_{3/2}$)$_d$
(HMePhSiO$_{1/2}$)$_c$(HMe$_2$SiO$_{1/2}$)$_d$(PhSiO$_{3/2}$)$_e$
(HMe$_2$SiO$_{1/2}$)$_c$(Ph$_2$SiO$_{2/2}$)$_d$(PhSiO$_{3/2}$)$_e$
(HMePhSiO$_{1/2}$)$_c$(Ph$_2$SiO$_{2/2}$)$_d$(PhSiO$_{3/2}$)$_e$
(HMe$_2$SiO$_{1/2}$)$_c$(Ph$_2$SiO$_{2/2}$)$_d$(NaphSiO$_{3/2}$)$_e$
(HMePhSiO$_{1/2}$)$_c$(Ph$_2$SiO$_{2/2}$)$_d$(NaphSiO$_{3/2}$)$_e$
(HMePhSiO$_{1/2}$)$_c$(HMe$_2$SiO$_{1/2}$)$_d$(NaphSiO$_{3/2}$)$_e$
(HMePhSiO$_{1/2}$)$_c$(HMe$_2$SiO$_{1/2}$)$_d$(Ph$_2$SiO$_{2/2}$)$_e$(NaphSiO$_{3/2}$)$_f$
(HMePhSiO$_{1/2}$)$_c$(HMe$_2$SiO$_{1/2}$)$_d$(Ph$_2$SiO$_{2/2}$)$_e$(PhSiO$_{3/2}$)$_f$ The content of component (B) is an amount such that the silicon-bonded hydrogen atoms in component (B) is in the range of from 0.1 to 10.0 moles, and preferably in the range of from 0.5 to 5 moles, relative to 1 mole of the alkenyl groups in component (A). When the content of component (B) is less than or equal to the upper limit of the aforementioned range, the mechanical characteristics of a cured product to be obtained is good. In contrast, when the content of component (B) is greater than or equal to the lower limit of the range, the curability of the obtained composition is good.

Component (C) is a hydrosilylation catalyst used to accelerate curing of the present composition. Examples of component (C) include platinum group element catalysts and platinum group element compound catalysts, and specific examples include platinum-based catalysts, rhodium-based catalysts, palladium-based catalysts, and combinations of at least two types thereof. In particular, platinum-based catalysts are preferable in that the curing of the present composition can be dramatically accelerated. Examples of these platinum-based catalysts include finely powdered platinum; platinum black; chloroplatinic acid, alcohol-modified chloroplatinic acid; chloroplatinic acid/diolefin complexes; platinum/olefin complexes; platinum/carbonyl complexes such as platinum bis(acetoacetate), and platinum bis(acetylacetonate); chloroplatinic acid/alkenylsiloxane complexes such as chloroplatinic acid/divinyltetramethyl disiloxane complexes and chloroplatinic acid/tetravinyl tetramethyl cyclotetrasiloxane complexes; platinum/alkenylsiloxane complexes such as platinum/divinyltetramethyl disiloxane complexes and platinum/tetravinyl tetramethyl cyclotetrasiloxane complexes; complexes of chloroplatinic acid and acetylene alcohols; and mixtures of two or more types thereof. In particular, platinum-alkenylsiloxane complexes are preferable in that the curing of the present composition can be accelerated.

Examples of the alkenylsiloxane used in the platinum-alkenylsiloxane complex include 1,3-divinyl-1,1,3,3-tetramethyldisiloxane, 1,3,5,7-tetramethyl-1,3,5,7-tetravinylcyclotetrasiloxane, alkenylsiloxane oligomers in which some of the methyl groups of these alkenylsiloxanes are substituted with ethyl groups, phenyl groups, or the like, and alkenylsiloxane oligomers in which the vinyl groups of these alkenylsiloxanes are substituted with allyl groups, hexenyl groups, or the like. In particular, 1,3-divinyl-1,1,3,3-tetramethyldisiloxane is preferable in that the stability of the platinum-alkenylsiloxane complex that is produced is good.

In order to improve the stability of the platinum-alkenylsiloxane complexes, it is preferable to dissolve these platinum-alkenylsiloxane complexes in an alkenylsiloxane oligomer such as 1,3-divinyl-1,1,3,3-tetramethyldisiloxane, 1,3-diallyl-1,1,3,3-tetramethyldisiloxane, 1,3-divinyl-1,3-dimethyl-1,3-diphenyldisiloxane, 1,3-divinyl-1,1,3,3-tetraphenyldisiloxane, or 1,3,5,7-tetramethyl-1,3,5,7-tetravinylcyclotetrasiloxane or an organosiloxane oligomer such as a dimethylsiloxane oligomer, and it is particularly preferable to dissolve the complexes in an alkenylsiloxane oligomer.

The content of component (C) is an amount that accelerates the curing of the present composition. Specifically, the content is preferably an amount such that the content of catalyst metal atoms in component (C) is in the range of from 0.01 to 500 ppm, in the range of from 0.01 to 100 ppm, or in the range of from 0.1 to 50 ppm in terms of mass units with respect to the present composition. This is because when the content of component (C) is greater than or equal to the lower limit of the aforementioned range, the curability of the obtained composition is good, whereas when the content of component (C) is less than or equal to the upper limit of the aforementioned range, the coloration of the obtained cured product is suppressed.

Component (D) is a maleate compound. Examples of component (D) include diallyl maleate, dimethyl maleate, bis(2-methoxy-1-methylethyl) maleate, mono-octyl maleate, mono-iso-octyl maleate, mono-allyl maleate, mono-methyl maleate, and 2-methoxy-1-methylethyl maleate.

The content of component (D) is an amount in a range of from 50 to 6,000 ppm and preferably in a range of from 100 ppm to 6,000 ppm or in a range of from 150 to 6,000 ppm in terms of mass units in the present composition. This is because when the content of component (D) is greater than or equal to the lower limit of the aforementioned range, surface wrinkling can be sufficiently prevented, whereas when the content of component (D) is less than or equal to the upper limit of the aforementioned range, the curability of the obtained composition is not diminished, and the physical properties of the obtained cured product are not diminished.

Component (E) is a hydrosilylation inhibitor other than the maleate compounds in order to prolong the usable life at room temperature and to improve storage stability. Examples of component (E) include alkyne alcohols such as 1-ethynylcyclohexan-1-ol, 2-methyl-3-butyn-2-ol, 3,5-dimethyl-1-hexyn-3-ol, and 2-phenyl-3-butyn-2-ol; enyne compounds such as 3-methyl-3-penten-1-yne and 3,5-dimethyl-3-hexen-1-yne; alkenyl group-containing low molecular weight siloxanes such as tetramethyltetravinylcyclotetrasiloxane and tetramethyltetrahexenylcyclotetrasiloxane; alkynoxysilanes such as dimethyl bis(3-methyl-1-butyn-3-oxy)silane and methylvinyl bis(3-methyl-1-butyn-3-oxy)silane, and triallylisocyanurate compounds.

The content of component (E) is an amount in a range of from 200 to 20,000 ppm and preferably in a range of from 200 ppm to 15,000 ppm or in a range of from 250 to 15,000 ppm in terms of mass units in the present composition. This is because when the content of component (E) is greater than or equal to the lower limit of the aforementioned range, storage stability of the present composition can be sufficiently imparted, whereas when the content of component (E) is less than or equal to the upper limit of the aforementioned range, the curability of the obtained composition is not diminished, and the physical properties of the obtained cured product are not diminished.

In addition, the present composition may also comprise (F) an adhesion promoter in order to further improve adhesion to the substrate with which the present composition makes contact during curing. Component (F) is preferably an organic silicon compound having one or more silicon-bonded alkoxy groups per molecule. Examples of the alkoxy groups include methoxy groups, ethoxy groups, propoxy groups, butoxy groups, and methoxyethoxy groups, and methoxy groups or ethoxy groups are particularly preferable. Examples of silicon-bonded groups other than alkoxy groups in component (F) include the same substituted or unsubstituted monovalent hydrocarbon groups as those described above such as alkyl groups, alkenyl groups, aryl groups, aralkyl groups, and halogenated alkyl groups; glycidoxyalkyl groups such as 3-glycidoxypropyl groups and 4-glycidoxybutyl groups; epoxycyclohexylalkyl groups such as 2-(3,4-epoxycyclohexyl)ethyl groups and 3-(3,4-epoxycyclohexyl)propyl groups; epoxyalkyl groups such as 4-epoxybutyl groups and 8-epoxyoctyl groups; acrylic group-containing monovalent organic groups such as 3-methacryloxypropyl groups; isocyanate groups; isocyanurate groups; and hydrogen atoms. Component (F) preferably has a group that can react with the aliphatic unsaturated hydrocarbon groups or silicon-bonded hydrogen atoms in the present composition. Specifically, component (F) preferably has silicon-bonded aliphatic unsaturated hydrocarbon groups or silicon-bonded hydrogen atoms.

The content of component (F) is not limited but is preferably in the range of from 0.01 to 50 parts by mass, in the range of from 0.01 to 30 parts by mass, in the range of from 0.01 to 10 parts by mass, in the range of from 0.01 to 5 parts by mass, or in the range of from 0.1 to 3 parts by mass, per 100 parts by mass of the present composition. When the content of component (F) is greater than or equal to the lower limit of the aforementioned range, sufficient adhesion can be imparted to the obtained composition. In contrast, when the content of component (F) is less than or equal to the lower limit of the range, the curability of the obtained composition is unlikely to be inhibited, and coloring of the cured product to be obtained, and the like can be suppressed.

The present composition may also comprise (G) a cerium-containing organopolysiloxane in order to suppress cracks due to thermal aging in a cured product obtained by curing the present composition. Such component (G) is prepared by means of a reaction with cerium chloride or a cerium salt of carboxylic acid and an alkali metal salt of a silanol-containing organopolysiloxane, for example.

Examples of cerium salts of carboxylic acid described above include cerium 2-ethylhexanoate, cerium naphthenate, cerium oleate, cerium laurate, and cerium stearate.

Examples of alkali metal salts of the silanol-containing organopolysiloxane described above include potassium salts of diorganopolysiloxanes capped at both molecular terminals with silanol groups, sodium salts of diorganopolysiloxanes capped at both molecular terminals with silanol groups, potassium salts of diorganopolysiloxanes capped at one molecular terminal with a silanol group and capped at the other molecular terminal with a triorganosiloxy group, and sodium salts of diorganopolysiloxanes capped at one molecular terminal with a silanol group and capped at the other molecular terminal with a triorganosiloxy group. Examples of groups bonding with the silicon atoms in the organopolysiloxane include alkyl groups having from 1 to 12 carbon atoms such as methyl groups, ethyl groups, propyl groups, isopropyl groups, n-butyl groups, isobutyl groups, tert-butyl groups, n-pentyl groups, neopentyl groups, hexyl groups, cyclohexyl groups, heptyl groups, octyl groups, nonyl groups, decyl groups, undecyl groups, and dodecyl groups; aryl groups having from 6 to 20 carbon atoms such as phenyl groups, tolyl groups, xylyl groups, and naphthyl groups; aralkyl groups having from 7 to 20 carbon atoms such as benzyl groups, phenethyl groups, and phenyl propyl groups; and groups in which some or all of the hydrogen atoms of these groups are substituted with halogen atoms such as fluorine atoms, chlorine atoms, or bromine atoms.

The reaction described above is performed at room temperature or by heating in an alcohol such as methanol, ethanol, isopropanol, or butanol; an aromatic hydrocarbon such as toluene or xylene; an aliphatic hydrocarbon such as hexane or heptane; and an organic solvent such as mineral spirit, ligroin, or petroleum ether. It is preferable to distill off the organic solvent or low-boiling point components or to filter any sediment from the resulting reaction product as necessary. In order to accelerate this reaction, dialkylformamide, hexaalkylphosphamide, or the like may be added. The content of cerium atoms in the cerium-containing organopolysiloxane prepared in this way is preferably within the range of from 0.1 to 5% by mass.

The content of component (G) in the present composition is an amount such that the cerium atoms are within the range of from 10 to 2,000 ppm in terms of mass units, preferably within the range of from 10 to 1,500 ppm, more preferably within the range of from 10 to 1,000 ppm, even more preferably within the range of from 10 to 500 ppm, and particularly preferably within the range of from 10 to 200 ppm. This is because the heat resistance of the resulting composition can be improved when the content of component (G) is greater than or equal to the lower limit of the range described above, and changes in luminescent chromaticity can be reduced when used in an optical semiconductor device when the content is less than or equal to the upper limit of the range described above.

The present composition may contain a phosphor for obtaining a light with a desired wavelength by altering the wavelength of light emitted from a light emitting element that is encapsulated or covered with the cured product of the present composition. Examples of this type of phosphor include yellow, red, green, and blue light emitting phosphors such as oxide phosphors, oxynitride phosphors, nitride phosphors, sulfide phosphors, and oxysulfide phosphors, which are widely used in light emitting diodes (LEDs). Examples of oxide phosphors include yttrium, aluminum, and garnet-type YAG green to yellow light emitting phosphors containing cerium ions; terbium, aluminum, and garnet-type TAG yellow light emitting phosphors containing cerium ions; and silicate green to yellow light emitting phosphors containing cerium or europium ions. Examples of oxynitride phosphors include silicon, aluminum, oxygen, and nitrogen-type SiAlON red to green light emitting phosphors containing europium ions. Examples of nitride-based phosphors include calcium, strontium, aluminum, silicon, and nitrogen-type CASN red light emitting phosphors containing europium ions. Examples of sulfide phosphors include ZnS green light emitting phosphors containing copper ions or aluminum ions. Examples of oxysulfide phosphors include $Y_2O_2S$ red light emitting phosphors containing europium ions. These fluorescent substances may be used as one type or as a mixture of two or more types. In the present composition, the content of the phosphor is in the range of from 0.1 to 70 mass %, and preferably in the range of from 1 to 20 mass %, relative to the total amount of components (A) and (B).

Moreover, the present composition may contain an inorganic filler such as silica, glass, alumina, zinc oxide, or the like; an organic resin fine powder of a polymethacrylate resin or the like; a heat-resistant agent, a dye, a pigment, a flame retardant, a solvent, or the like as an optional component as long as the object of the present invention is not impaired.

The present composition is cured either at room temperature or under heating, but it is preferable to heat the composition in order to achieve rapid curing. The heating temperature is preferably in the range of from 50 to 200° C.

EXAMPLES

The hydrosilylation-curable silicone composition of the present invention will be described in detail hereinafter using Practical Examples and Comparative Examples. The hydrosilylation-curable silicone composition was evaluated as follows.

<Storage Stability of Hydrosilylation-Curable Silicone Composition>

The storage stability of the hydrosilylation-curable silicone composition was evaluated based on the heat generation peak temperature (° C.) measured at a heating rate of 10° C./min. using a differential scanning calorimeter (DSC7000; manufactured by SII Nanotechnology Inc.).

<Curability of Hydrosilylation-Curable Silicone Composition>

Curability of the hydrosilylation-curable silicone composition was evaluated using a rheometer MDR 2000 (manufactured by Alpha Technologies, Ltd.). The curing temperature was 150° C. For the measurement, the time (minutes) taken to obtain 1% torque value was indicated by $Ts_1$, and the time (minutes) taken to obtain 90% torque value was indicated by $T_{90}$.

<Surface Wrinkle of Cured Product>

5 g of the hydrosilylation-curable silicone composition was poured into an aluminum Petri dish of diameter 60 mm, by heating at 150° C. for 1 hour to form a cured product. The appearance of the cured product was visually observed as follows.

N: Wrinkle was not observed
Y: Wrinkle was observed

Practical Examples 1 to 14 and Comparative Examples 1 to 16

The following components were uniformly mixed according to the compositions (parts by mass) shown in Tables 1 to 5 to prepare the hydrosilylation-curable silicone compositions of Practical Examples 1 to 14 and Comparative Examples 1 to 16. In the formulae, "Me", "Vi", "Ph", and "Ep" represent a methyl group, vinyl group, phenyl group, and a 3-glycidoxypropyl group, respectively. Moreover, in Tables 1 to 5, "SiH/Vi" represents the moles of silicon-bonded hydrogen atoms in component (B) per 1 mole of vinyl groups in component (A) in the hydrosilylation-curable silicone compositions.

The following components were used as component (A).
Component (a-1): an organopolysiloxane having two or more vinyl groups per molecule and represented by the following average unit formula:

$(Me_2ViSiO_{1/2})_{0.25}(PhSiO_{3/2})_{0.75}$

Component (a-2): an organopolysiloxane represented by the following average formula:

$Me_2ViSiO(Me_2SiO)_{200}(Ph_2SiO)_{50}SiMe_2Vi$

Component (a-3): an organopolysiloxane having two or more vinyl groups per molecule and represented by the following average unit formula:

$(Me_2ViSiO_{1/2})_{0.13}(Me_3SiO_{1/2})_{0.14}(MeSiO_{3/2})_{0.53}(PhSiO_{3/2})_{0.22}$

Component (a-4): a mixture consisting of 30 mass % of an organopolysiloxane having two or more vinyl groups per molecule and represented by the following average unit formula:

$(Me_3SiO_{1/2})_{0.47}(Me_2ViSiO_{1/2})_{0.05}(SiO_{4/2})_{0.48}$ and 70 mass % of a dimethylpolysiloxane (content of vinyl groups=0.23 mass %) terminated with dimethylvinylsiloxy groups at both molecular terminals.

Component (a-5): an organopolysiloxane having two or more vinyl groups per molecule and represented by the following average unit formula:

$(Me_2ViSiO_{1/2})_{0.20}(PhSiO_{3/2})_{0.80}$

Component (a-6): an organopolysiloxane represented by the following average formula:

$Me_2ViSiO(MePhSiO)_{25}SiMe_2Vi$

Component (a-7): an organopolysiloxane represented by the following formula:

$(Me_2ViSiO)_4Si$

The following components were used as component (B).
Component (b-1): an organohydrogenpolysiloxane represented by the following formula:

$HMe_2SiO(Ph_2SiO)SiMe_2H$

Component (b-2): an organohydrogenpolysiloxane represented by the following formula:

$(Me_2HSiO_{1/2})_{0.60}(PhSiO_{3/2})_{0.40}$

Component (b-3): an organohydrogenpolysiloxane represented by the following average formula:

$Me_3SiO(MeHSiO)_{40}SiMe_3$

The following component was used as component (C).
Component (c-1): a 1,3-divinyltetramethyldisiloxane solution of a 1,3-divinyltetramethyldisiloxane complex of platinum (platinum metal content=approximately 4,000 ppm)

The following components were used as component (D).
Component (d-1): diallyl maleate
Component (d-2): bis(ethylhexyl) maleate The following components were used as component (E).
Component (e-1): 1-ethynylcyclohexan-1-ol
Component (e-2): 1,3,5,7-tetoramethyl-1,3,5,7-tetravinyl-cyclotetrasiloxane The following component was used as component (F).
Component (f-1): an organopolysiloxane represented by the following average unit formula:

$(Me_2ViSiO_{1/2})_{0.18}(MeEpSiO_{2/2})_{0.28}(PhSiO_{3/2})_{0.54}$

The following component was used as component (G).
Component (g-1): Cerium-containing dimethylpolysiloxane with cerium content of 1.4% by mass The following component was used as an arbitrary component.

Component (h-1): silica filler with BET surface area of 100 m²/g

TABLE 1

| | | | Category | | | | | | |
|---|---|---|---|---|---|---|---|---|---|
| | | | Practical Examples | | | Comparative Examples | | | |
| Item | | | 1 | 2 | 3 | 1 | 2 | 3 | 4 |
| Composition of | (A) | (a-1) | 39.31 | 39.22 | 39.08 | 39.31 | 39.22 | 39.08 | 38.89 |
| hydrosilylation- | | (a-6) | 48.04 | 47.93 | 47.76 | 48.04 | 47.93 | 47.76 | 47.53 |
| curable silicone | (B) | (b-1) | 6.14 | 6.19 | 6.27 | 6.14 | 6.19 | 6.27 | 6.38 |
| composition | | (b-2) | 6.14 | 6.19 | 6.27 | 6.14 | 6.19 | 6.27 | 6.38 |
| (parts by mass) | (C) | (c-1) | 0.006 | 0.006 | 0.006 | 0.006 | 0.006 | 0.006 | 0.006 |
| | (D) | (d-1) | 0.05 | 0.15 | 0.30 | — | — | — | — |
| | (E) | (e-1) | — | — | — | 0.05 | 0.15 | 0.30 | 0.50 |
| | | (e-2) | 0.31 | 0.31 | 0.31 | 0.31 | 0.31 | 0.31 | 0.31 |
| SiH/Vi | | | 0.7 | 0.7 | 0.7 | 0.6 | 0.7 | 0.7 | 0.7 |
| Storage Stability (° C.) | | | 111 | 118 | 126 | 108 | 115 | 122 | 128 |
| Curability | $Ts_1$ (min.) | | 0.48 | 0.69 | 0.75 | 0.39 | 0.46 | 0.56 | 0.78 |
| | $T_{90}$ (min.) | | 12.4 | 14.15 | 15.68 | 10.21 | 10.31 | 11.24 | 11.95 |
| Surface Wrinkle | | | N | N | N | N | Y | Y | Y |

TABLE 2

| | | | Category | | | | |
|---|---|---|---|---|---|---|---|
| | | | Practical Examples | Comparative Examples | | | |
| Item | | | 4 | 5 | 6 | 7 | 8 |
| Composition of | (A) | (a-2) | 34.96 | 34.96 | 34.96 | 34.96 | 34.96 |
| hydrosilylation- | | (a-3) | 51.30 | 52.32 | 52.97 | 51.83 | 51.30 |
| curable silicone | (B) | (b-1) | 10.99 | 10.79 | 10.98 | 10.87 | 10.99 |
| composition | | (b-2) | 1.94 | 1.56 | 1.63 | 1.72 | 1.94 |
| (parts by mass) | (C) | (c-1) | 0.006 | 0.006 | 0.006 | 0.006 | 0.006 |
| | (D) | (d-1) | 0.50 | — | — | — | — |
| | (E) | (e-1) | — | 0.05 | 0.15 | 0.30 | 0.50 |
| | | (e-2) | 0.31 | 0.31 | 0.31 | 0.31 | 0.31 |
| SiH/Vi | | | 1.6 | 1.6 | 1.6 | 1.6 | 1.6 |
| Storage Stability (° C.) | | | 137 | 109 | 115 | 122 | 129 |
| Curability | $Ts_1$ (min.) | | 0.8 | 0.29 | 0.38 | 0.5 | 0.6 |
| | $T_{90}$ (min.) | | 18.29 | 8.35 | 10.03 | 12.2 | 12.93 |
| Surface Wrinkle | | | N | Y | Y | Y | Y |

TABLE 3

| | | | Category | | | | | |
|---|---|---|---|---|---|---|---|---|
| | | | Practical Examples | | | Comparative Examples | | |
| Item | | | 5 | 6 | 7 | 9 | 10 | 11 |
| Composition of | (A) | (a-4) | 97.23 | 97.09 | 96.87 | 97.23 | 97.09 | 96.87 |
| hydrosilylation- | (B) | (b-3) | 2.40 | 2.44 | 2.51 | 2.40 | 2.44 | 2.51 |
| curable silicone | (C) | (c-1) | 0.006 | 0.006 | 0.006 | 0.006 | 0.006 | 0.006 |
| composition | (D) | (d-1) | 0.05 | 0.15 | 0.30 | — | — | — |
| (parts by mass) | (E) | (e-1) | — | — | — | 0.05 | 0.15 | 0.30 |
| | | (e-2) | 0.31 | 0.31 | 0.31 | 0.31 | 0.31 | 0.31 |
| SiH/Vi | | | 1.4 | 1.4 | 1.5 | 1.4 | 1.4 | 1.5 |
| Storage Stability (° C.) | | | 148 | 155 | 164 | 148 | 151 | 164 |
| Curability | $Ts_1$ (min.) | | 0.47 | 1.81 | 7.06 | 0.79 | 2.21 | 6.68 |
| | $T_{90}$ (min.) | | 4.65 | 8.12 | 9.17 | 5.01 | 8.73 | 9.80 |
| Surface Wrinkle | | | N | N | N | Y | Y | Y |

TABLE 4

| Item | | | Practical Examples | | | | | | Comparative Examples | | |
|---|---|---|---|---|---|---|---|---|---|---|---|
| | | | 8 | 9 | 10 | 11 | 12 | 13 | 12 | 13 | 14 |
| Composition of hydrosilylation-curable silicone composition (parts by mass) | (A) | (a-1) | 3.27 | 3.27 | 3.27 | 3.27 | 3.27 | 3.27 | 3.27 | 3.27 | 3.27 |
| | | (a-3) | 43.73 | 43.71 | 43.71 | 43.73 | 43.71 | 43.71 | 43.73 | 43.71 | 43.71 |
| | | (a-5) | 19.66 | 19.66 | 19.66 | 19.66 | 19.66 | 19.66 | 19.66 | 19.66 | 19.66 |
| | | (a-6) | 7.88 | 7.88 | 7.88 | 7.88 | 7.88 | 7.88 | 7.88 | 7.88 | 7.88 |
| | (B) | (b-1) | 18.10 | 18.10 | 18.08 | 18.10 | 18.10 | 18.08 | 18.10 | 18.10 | 18.10 |
| | | (b-2) | 3.83 | 3.83 | 3.81 | 3.83 | 3.83 | 3.81 | 3.83 | 3.83 | 3.81 |
| | (C) | (c-1) | 0.006 | 0.006 | 0.006 | 0.006 | 0.006 | 0.006 | 0.006 | 0.006 | 0.006 |
| | (D) | (d-1) | 0.02 | 0.05 | 0.10 | — | — | — | — | — | — |
| | | (d-2) | — | — | — | 0.02 | 0.05 | 0.10 | — | — | — |
| | (E) | (e-1) | — | — | — | — | — | — | 0.02 | 0.05 | 0.10 |
| | | (e-2) | 1.28 | 1.28 | 1.28 | 1.28 | 1.28 | 1.28 | 1.28 | 1.28 | 1.28 |
| | (F) | (f-1) | 2.00 | 2.00 | 2.00 | 2.00 | 2.00 | 2.00 | 2.00 | 2.00 | 2.00 |
| | (G) | (g-1) | 0.22 | 0.22 | 0.22 | 0.22 | 0.22 | 0.22 | 0.22 | 0.22 | 0.22 |
| SiH/Vi | | | 1.6 | 1.6 | 1.6 | 1.6 | 1.6 | 1.6 | 1.6 | 1.6 | 1.6 |
| Storage Stability (° C.) | | | 105 | 112 | 115 | 102 | 109 | 113 | 101 | 107 | 112 |
| Curability | $Ts_1$ (min.) | | 0.30 | 0.59 | 0.49 | 0.34 | 0.35 | 0.46 | 0.26 | 0.27 | 0.31 |
| | $T_{90}$ (min.) | | 2.68 | 6.52 | 8.90 | 3.63 | 4.43 | 8.57 | 2.41 | 2.49 | 2.80 |
| Surface Wrinkle | | | N | N | N | N | N | N | Y | Y | Y |

TABLE 5

| Item | | | Practical Examples | Comparative Examples | |
|---|---|---|---|---|---|
| | | | 14 | 15 | 16 |
| Composition of hydrosilylation-curable silicone composition (parts by mass) | (A) | (a-5) | 53.29 | 53.29 | 53.29 |
| | | (a-6) | 21.51 | 21.51 | 21.51 |
| | | (a-7) | 2.00 | 2.00 | 2.00 |
| | (B) | (b-1) | 20.16 | 20.16 | 20.16 |
| | (C) | (c-1) | 0.005 | 0.005 | 0.005 |
| | (D) | (d-1) | — | — | 0.03 |
| | | (d-2) | 0.05 | — | 0.03 |
| | (E) | (e-1) | 0.03 | 0.02 | — |
| | | (e-2) | — | 0.50 | — |
| | (F) | (f-1) | 2.50 | 2.50 | 2.50 |
| | Other | (h-1) | 1.5 | 1.5 | 1.5 |
| SiH/Vi | | | 1.0 | 1.0 | 1.0 |
| Storage Stability (° C.) | | | 109.1 | 110.9 | 95 |
| Curability | $Ts_1$ (min.) | | 4.12 | 1.50 | 3.39 |
| | $T_{90}$ (min.) | | 10.32 | 5.58 | 11.11 |
| Surface Wrinkle | | | N | Y | N |

INDUSTRIAL APPLICABILITY

The hydrosilylation-curable silicone composition of the present invention is useful as a sealing agent or an adhesive for optical semiconductor elements such as light emitting diodes (LEDs), semiconductor lasers, photodiodes, phototransistors, solid-state image sensing device, light emitters and receivers for photocouplers, or the like.

The invention claimed is:

1. A hydrosilylation-curable silicone composition comprising:
   (A) an organopolysiloxane having at least two alkenyl groups per molecule;
   (B) an organohydrogenpolysiloxane having at least two silicon-bonded hydrogen atoms per molecule, in an amount such that 0.1 to 10.0 moles of the silicon-bonded hydrogen atoms is provided relative to 1 mole of the alkenyl groups in component (A), wherein the organohydrogenpolysiloxane comprises organohydrogenpolysiloxanes represented by the formulae $HMe_2SiO(Ph_2SiO)_ySiMe_2H$ and $(HMe_2SiO_{1/2})_c(PhSiO_{3/2})_d$,
   wherein Me and Ph represent a methyl group and a phenyl group respectively, y is an integer of from 1 to 100, c and d are positive numbers and the sum of c and d in the molecule is 1;
   (C) a hydrosilylation catalyst, in an amount sufficient to accelerate curing of the composition;
   (D) a maleate compound, in an amount of 50 to 6,000 ppm with respect to the composition in terms of mass units; and
   (E) a hydrosilylation inhibitor other than the maleate compound, in an amount of 200 to 20,000 ppm with respect to the composition in terms of mass units.

2. The hydrosilylation-curable silicone composition according to claim 1, further comprising (F) an adhesion promoter, in an amount of from 0.01 to 50 parts by mass per 100 parts by mass of components (A) to (E).

3. The hydrosilylation-curable silicone composition according to claim 1, further comprising (G) a cerium-containing organopolysiloxane, in an amount such that the amount of cerium atoms in this component is from 10 to 2,000 ppm with respect to the composition in terms of mass units.

4. The hydrosilylation-curable organopolysiloxane composition according to claim 1, which is a sealing, a coating, or an adhesive for an optical semiconductor element.

5. The hydrosilylation-curable organopolysiloxane composition according to claim 1, wherein the organohydrogenpolysiloxane comprises organohydrogenpolysiloxanes represented by the formulae $HMe_2SiO(Ph_2SiO)SiMe_2H$ and $(HMe_2SiO_{1/2})_{0.60}(PhSiO_{3/2})_{0.40}$.

* * * * *